United States Patent
Tsai et al.

(10) Patent No.: US 8,835,243 B2
(45) Date of Patent: Sep. 16, 2014

(54) SEMICONDUCTOR PROCESS

(75) Inventors: Tzung-I Tsai, Tainan (TW); Shui-Yen Lu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 89 days.

(21) Appl. No.: 13/463,819

(22) Filed: May 4, 2012

(65) Prior Publication Data

US 2013/0295735 A1 Nov. 7, 2013

(51) Int. Cl.
 *H01L 21/8248* (2006.01)

(52) U.S. Cl.
 USPC ......... 438/230; 438/233; 257/69; 257/E21.64

(58) Field of Classification Search
 CPC .................. H01L 21/8238; H01L 21/82382
 USPC .............. 438/230, 704, 233; 257/69, E21.64; 216/57
 See application file for complete search history.

(56) References Cited

U.S. PATENT DOCUMENTS

| | | | |
|---|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,447,884 A | 9/1995 | Fahey |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,245,626 B1 | 6/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |

(Continued)

*Primary Examiner* — Caridad Everhart
(74) *Attorney, Agent, or Firm* — Winston Hsu; Scott Margo (57) ABSTRACT

A semiconductor process includes the following steps. A first structure and a second structure are formed on a substrate. An oxide layer is entirely formed to cover the first structure and the second structure. A nitride layer is formed to entirely cover the oxide layer. A dry etching process is performed to remove a part of the nitride layer on the first structure. A wet etching process is performed to entirely remove the nitride layer and the oxide layer on the first structure and the second structure.

20 Claims, 6 Drawing Sheets

(56) References Cited

U.S. PATENT DOCUMENTS

| | | | |
|---|---|---|---|
| 6,652,718 B1 | 11/2003 | D'Couto | |
| 6,664,156 B1 | 12/2003 | Ang | |
| 6,676,764 B2 | 1/2004 | Joo | |
| 6,699,763 B2 | 3/2004 | Grider | |
| 6,703,271 B2 | 3/2004 | Yeo | |
| 6,777,275 B1 | 8/2004 | Kluth | |
| 6,806,151 B2 | 10/2004 | Wasshuber | |
| 6,809,402 B1 | 10/2004 | Hopper | |
| 6,858,506 B2 | 2/2005 | Chang | |
| 6,861,318 B2 | 3/2005 | Murthy | |
| 6,864,135 B2 | 3/2005 | Grudowski | |
| 6,869,867 B2 | 3/2005 | Miyashita | |
| 6,887,751 B2 | 5/2005 | Chidambarrao | |
| 6,887,762 B1 | 5/2005 | Murthy | |
| 6,891,192 B2 | 5/2005 | Chen | |
| 6,930,007 B2 | 8/2005 | Bu | |
| 6,946,350 B2 | 9/2005 | Lindert | |
| 6,962,856 B2 | 11/2005 | Park | |
| 6,972,461 B1 | 12/2005 | Chen | |
| 6,991,979 B2 | 1/2006 | Ajmera | |
| 6,991,991 B2 | 1/2006 | Cheng | |
| 7,037,773 B2 | 5/2006 | Wang | |
| 7,060,576 B2 | 6/2006 | Lindert | |
| 7,060,579 B2 | 6/2006 | Chidambaram | |
| 7,112,495 B2 | 9/2006 | Ko | |
| 7,118,952 B2 | 10/2006 | Chen | |
| 7,118,987 B2 | 10/2006 | Fu | |
| 7,119,404 B2 | 10/2006 | Chang | |
| 7,132,338 B2 | 11/2006 | Samoilov | |
| 7,138,323 B2 | 11/2006 | Kavalieros | |
| 7,169,675 B2 | 1/2007 | Tan | |
| 7,183,596 B2 | 2/2007 | Wu | |
| 7,202,124 B2 | 4/2007 | Fitzgerald | |
| 7,217,627 B2 | 5/2007 | Kim | |
| 7,271,464 B2 | 9/2007 | Trivedi | |
| 7,288,822 B1 | 10/2007 | Ting | |
| 7,303,999 B1 | 12/2007 | Sriraman | |
| 7,314,793 B2 | 1/2008 | Frohberg | |
| 7,335,959 B2 | 2/2008 | Curello | |
| 7,396,728 B2 | 7/2008 | Varghese | |
| 7,410,859 B1 | 8/2008 | Peidous | |
| 7,456,067 B2 | 11/2008 | Ang | |
| 7,462,239 B2 | 12/2008 | Brabant | |
| 7,482,245 B1 | 1/2009 | Yu | |
| 7,491,615 B2 | 2/2009 | Wu | |
| 7,494,856 B2 | 2/2009 | Zhang | |
| 7,494,858 B2 | 2/2009 | Bohr | |
| 7,517,816 B2 | 4/2009 | Frohberg | |
| 7,550,336 B2 | 6/2009 | Hsiao | |
| 7,592,231 B2 | 9/2009 | Cheng | |
| 7,667,227 B2 | 2/2010 | Shimamune | |
| 7,691,752 B2 | 4/2010 | Ranade | |
| 7,767,534 B2 | 8/2010 | Yang | |
| 7,838,370 B2 | 11/2010 | Mehta | |
| 8,030,154 B1 * | 10/2011 | Ozcan et al. | 438/230 |
| 2002/0135071 A1 | 9/2002 | Kang | |
| 2002/0160587 A1 | 10/2002 | Jagannathan | |
| 2002/0182423 A1 | 12/2002 | Chu | |
| 2003/0181005 A1 | 9/2003 | Hachimine | |
| 2003/0203599 A1 | 10/2003 | Kanzawa | |
| 2004/0045499 A1 | 3/2004 | Langdo | |
| 2004/0067631 A1 | 4/2004 | Bu | |
| 2004/0227164 A1 | 11/2004 | Lee | |
| 2005/0070076 A1 | 3/2005 | Dion | |
| 2005/0079692 A1 | 4/2005 | Samoilov | |
| 2005/0082616 A1 | 4/2005 | Chen | |
| 2005/0139231 A1 | 6/2005 | Abadie | |
| 2005/0260830 A1 | 11/2005 | Kwon | |
| 2005/0285193 A1 | 12/2005 | Lee | |
| 2005/0287752 A1 | 12/2005 | Nouri | |
| 2006/0001095 A1 | 1/2006 | Doris | |
| 2006/0051922 A1 | 3/2006 | Huang | |
| 2006/0057859 A1 | 3/2006 | Chen | |
| 2006/0076627 A1 | 4/2006 | Chen | |
| 2006/0088968 A1 | 4/2006 | Shin | |
| 2006/0115949 A1 | 6/2006 | Zhang | |
| 2006/0163558 A1 | 7/2006 | Lee | |
| 2006/0197161 A1 | 9/2006 | Takao | |
| 2006/0228842 A1 | 10/2006 | Zhang | |
| 2006/0231826 A1 | 10/2006 | Kohyama | |
| 2006/0258126 A1 | 11/2006 | Shiono | |
| 2006/0281245 A1 | 12/2006 | Okuno | |
| 2006/0281288 A1 | 12/2006 | Kawamura | |
| 2006/0292779 A1 | 12/2006 | Chen | |
| 2006/0292783 A1 | 12/2006 | Lee | |
| 2007/0023847 A1 | 2/2007 | Rhee | |
| 2007/0034906 A1 | 2/2007 | Wang | |
| 2007/0034963 A1 * | 2/2007 | Sudo | 257/369 |
| 2007/0049014 A1 | 3/2007 | Chen | |
| 2007/0072353 A1 | 3/2007 | Wu | |
| 2007/0072376 A1 | 3/2007 | Chen | |
| 2007/0082451 A1 | 4/2007 | Samoilov | |
| 2007/0128783 A1 | 6/2007 | Ting | |
| 2007/0141852 A1 | 6/2007 | Stapelmann | |
| 2007/0166929 A1 | 7/2007 | Matsumoto | |
| 2007/0262396 A1 | 11/2007 | Zhu | |
| 2008/0014688 A1 | 1/2008 | Thean | |
| 2008/0061366 A1 | 3/2008 | Liu | |
| 2008/0067545 A1 | 3/2008 | Rhee | |
| 2008/0076236 A1 | 3/2008 | Chiang | |
| 2008/0085577 A1 | 4/2008 | Shih | |
| 2008/0116525 A1 | 5/2008 | Liu | |
| 2008/0124874 A1 | 5/2008 | Park | |
| 2008/0128746 A1 | 6/2008 | Wang | |
| 2008/0142886 A1 | 6/2008 | Liao | |
| 2008/0164530 A1 * | 7/2008 | Wang et al. | 257/369 |
| 2008/0173947 A1 | 7/2008 | Hou | |
| 2008/0220579 A1 | 9/2008 | Pal | |
| 2008/0233722 A1 | 9/2008 | Liao | |
| 2008/0233746 A1 | 9/2008 | Huang | |
| 2008/0242020 A1 | 10/2008 | Chen | |
| 2009/0039389 A1 | 2/2009 | Tseng | |
| 2009/0045456 A1 | 2/2009 | Chen | |
| 2009/0095992 A1 | 4/2009 | Sanuki | |
| 2009/0117715 A1 | 5/2009 | Fukuda | |
| 2009/0124056 A1 * | 5/2009 | Chen et al. | 438/278 |
| 2009/0159981 A1 | 6/2009 | Niimi | |
| 2009/0166625 A1 | 7/2009 | Ting | |
| 2009/0184402 A1 | 7/2009 | Chen | |
| 2009/0186475 A1 | 7/2009 | Ting | |
| 2009/0230439 A1 | 9/2009 | Wang | |
| 2009/0246922 A1 | 10/2009 | Wu | |
| 2009/0278170 A1 | 11/2009 | Yang | |
| 2009/0289284 A1 | 11/2009 | Goh | |
| 2009/0302348 A1 | 12/2009 | Adam | |
| 2010/0001317 A1 | 1/2010 | Chen | |
| 2010/0093147 A1 | 4/2010 | Liao | |
| 2010/0184359 A1 | 7/2010 | Park | |
| 2011/0210393 A1 * | 9/2011 | Chen et al. | 257/347 |
| 2011/0248359 A1 * | 10/2011 | Hwang et al. | 257/410 |
| 2012/0161240 A1 * | 6/2012 | Kronholz et al. | 257/368 |

* cited by examiner

SEMICONDUCTOR PROCESS

BACKGROUND OF THE INVENTION

1. Field of the Invention

The present invention generally relates to a semiconductor process, and more specifically to a semiconductor process, that performs a dry etching process to etch parts of a material layer and then performs a wet etching process to entirely remove the material layer.

2. Description of the Prior Art

With the trend of miniaturization of semiconductor devices dimensions, the scale of the gate, source and drain of a transistor decreases in accordance with the reduction of the critical dimension (CD). Due to physical limitations of the materials used, the decrease of the scale of the gate, source and drain also results in the decrease of the carriers that determine the magnitude of the current in the transistor, which can therefore adversely affect the performances of the transistor. Increasing the carrier mobility in order to boost up a MOS transistor is an important matter in the field of current semiconductor techniques.

One of the methods for applying stresses onto MOS transistors is a stress memorization technique (SMT), which enhances the carrier mobility. The processing steps of the stress memorization technique (SMT) include: (1) performing a pre-amorphization implant (PAI) process to form an amorphization layer on the surface of a silicon substrate; (2) depositing a stress layer on the silicon substrate; (3) performing a thermal treatment process to keep applying the stresses of the stress layer onto the silicon substrate; (4) removing the stress layer.

However, since the material of the stress layer is similar to that of a spacer beside a gate, the spacer will be damaged when the stress layer is removed. Thus, an inner spacer or a gate will be exposed, resulting in circuit leakages.

SUMMARY OF THE INVENTION

The present invention provides a semiconductor process that performs a dry etching process to remove parts of a stress layer and then performs a wet etching process to entirely remove the stress layer. Therefore, the stress layer is entirely removed without damaging a spacer covered by the stress layer.

The present invention provides a semiconductor process including the following steps. A first structure and a second structure are formed on a substrate. An oxide layer is formed to entirely cover the first structure and the second structure. A nitride layer is formed to entirely cover the oxide layer. A dry etching process is performed to remove parts of the nitride layer on the first structure. A wet etching process is performed to entirely remove the nitride layer and the oxide layer on the first structure and the second structure.

According to the above, the present invention provides a semiconductor process, that performs a dry etching process to remove parts of a stress layer on one of two structures, and then performs a wet etching process to entirely remove the stress layer (and a buffer layer) on the two structures. Thus, the semiconductor process of the present invention can entirely remove the stress layer on the two structures without damaging the spacer layer covered by the stress layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
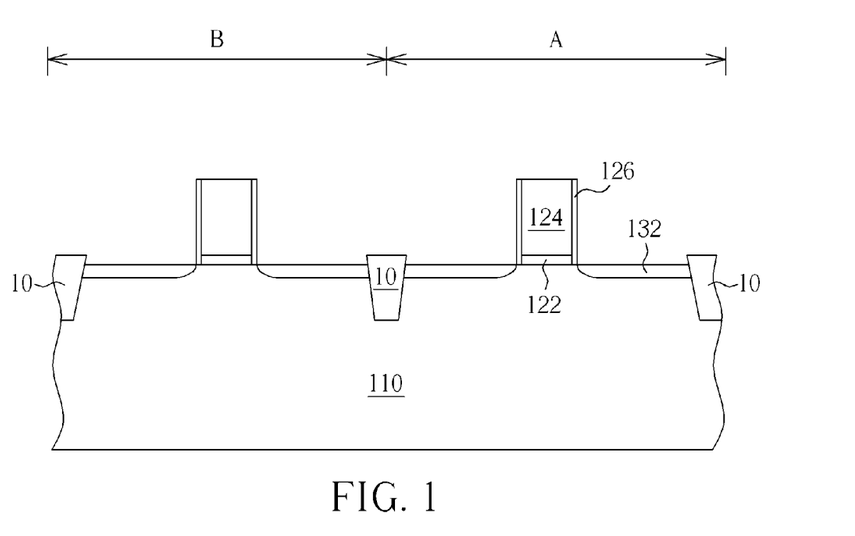
FIGS. 1-8 schematically depict cross-sectional views of a semiconductor process according to an embodiment of the present invention.

FIGS. 1-8 schematically depict cross-sectional views of a semiconductor process according to an embodiment of the present invention. As shown in FIG. 1, a substrate 110 is provided. The substrate 110 may be divided into an area A and an area B, wherein the area A will be a PMOS transistor area in later processes, and the area B will be a NMOS transistor area in later processes, but it is not limited thereto. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 may be formed between each transistor to electrically isolate them from each other. The isolation structure 10 may be a shallow trench isolation structure, but it is not limited thereto. A dielectric layer (not shown) and a gate layer (not shown) are formed on the substrate 110, and then are patterned to form a stacked structure including a dielectric layer 122 and a gate layer 124. A spacer 126 is formed on the substrate 110 beside the dielectric layer 122 and the gate layer 124. A lightly doped ion implantation process is performed to respectively form a lightly doped source/drain region 132 in the substrate 110 beside the spacer 126.

Figure 2:
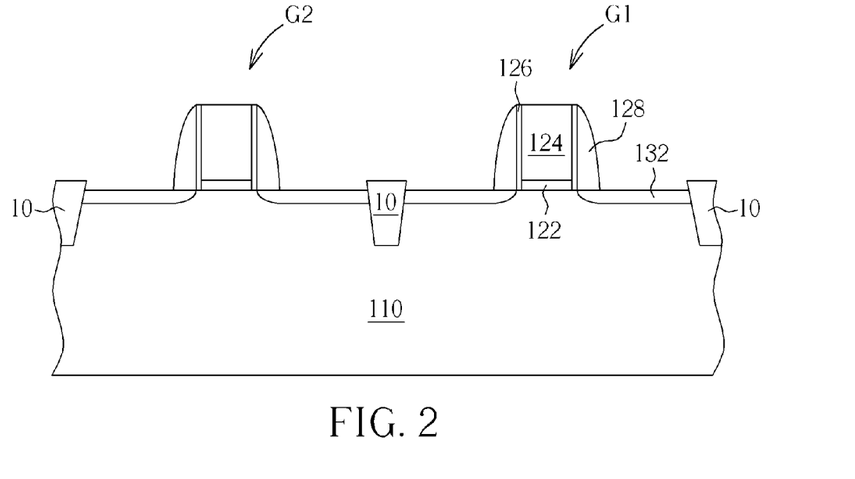

As shown in FIG. 2, a spacer 128 is formed on the substrate 110 beside the spacer 126. In this embodiment, the spacer 128 is a nitride layer, which may be formed by a precursor of hexachlorodisilane (HCD), but it is not limited thereto. In this way, a first structure G1 and a second structure G2 are formed, wherein the first structure G1 will be a gate of a PMOS transistor in later processes, and the second structure G2 will be a gate of a NMOS transistor in later processes, but it is not limited thereto.

Figure 3:
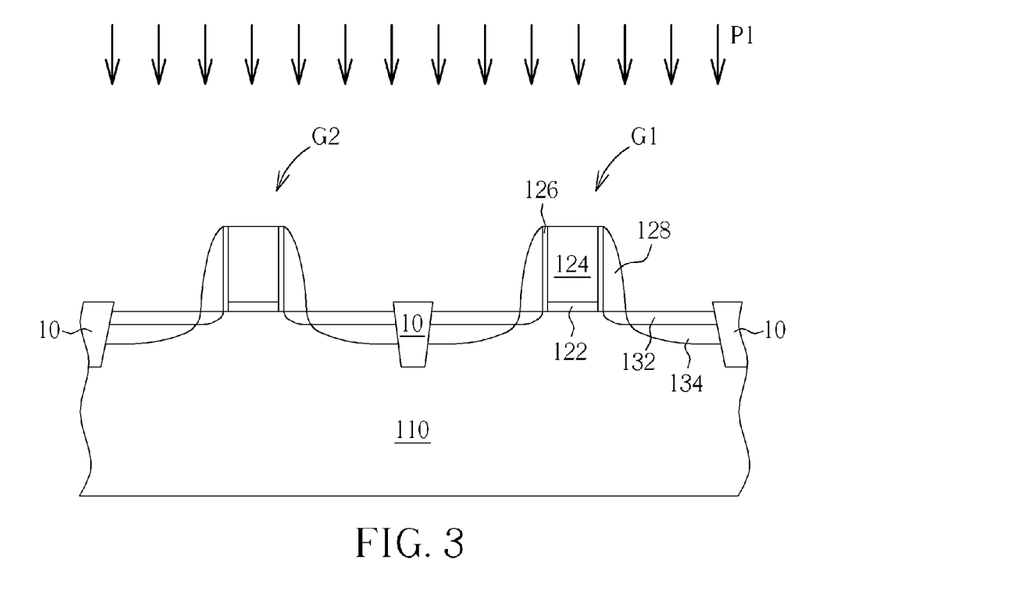

As shown in FIG. 3, a source/drain ion implantation process P1 is performed to form a source/drain region 134 in the substrate 110 beside each of the first structure G1 and the second structure G2, wherein P-type dopants and N-type dopants are doped respectively during the source/drain ion implantation process P1. An annealing process (not shown) may be selectively performed to activate the source/drain region 134. The source/drain region 134 can also be activated by later processes.

Figure 4:
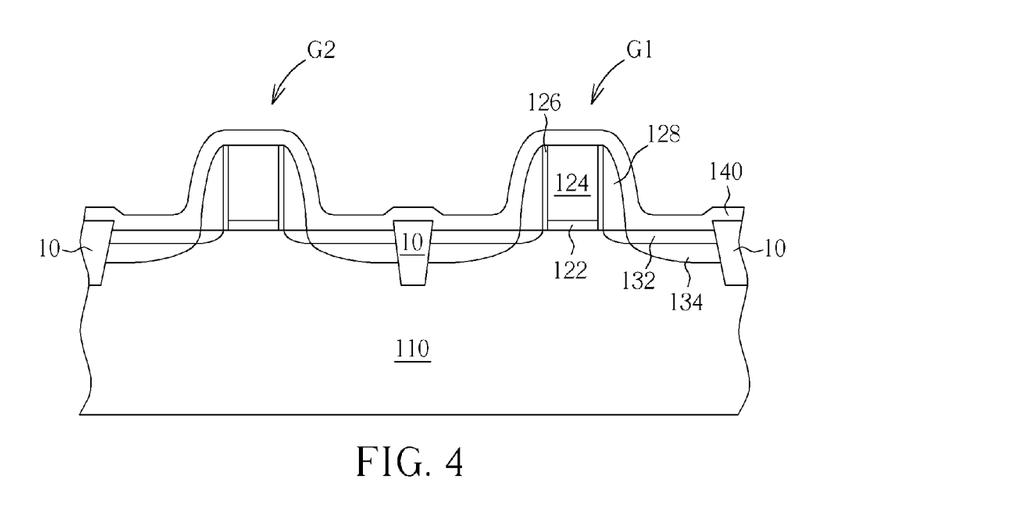
Figure 5:
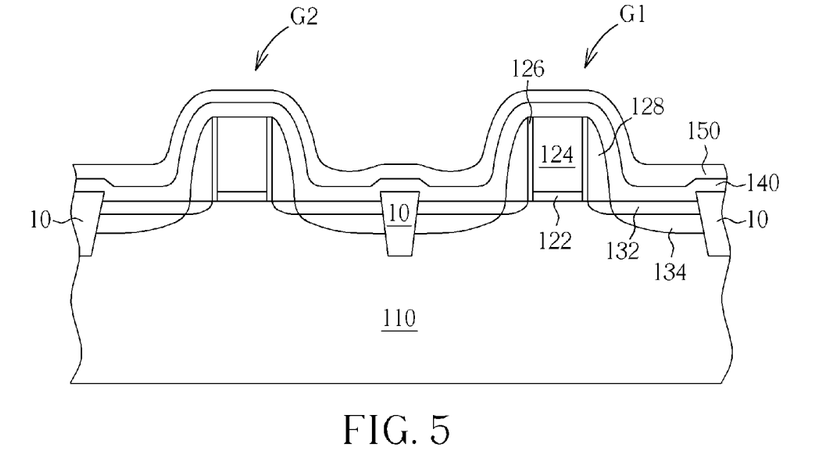

As shown in FIG. 4, a pre-amorphization implant (PAI) process, having argon imported for example, may be selectively performed on the surface of the substrate 110, and an amorphization layer (not shown) is therefore formed on the surface of the substrate 110 as the surface of the substrate 110 is amorphized insufficiently by the source/drain ion implantation process P1. An oxide layer 140 is formed to entirely cover the first structure G1, the second structure G2 and substrate 110 by methods such as a deposition process. As shown in FIG. 5, a nitride layer 150 is formed to entirely cover the oxide layer 140 by methods such as a deposition process. In this embodiment, the nitride layer 150 is a stress layer and the oxide layer 140 is a buffer layer located between the stress layer and the substrate 110, but it is not limited thereto.

Figure 6:
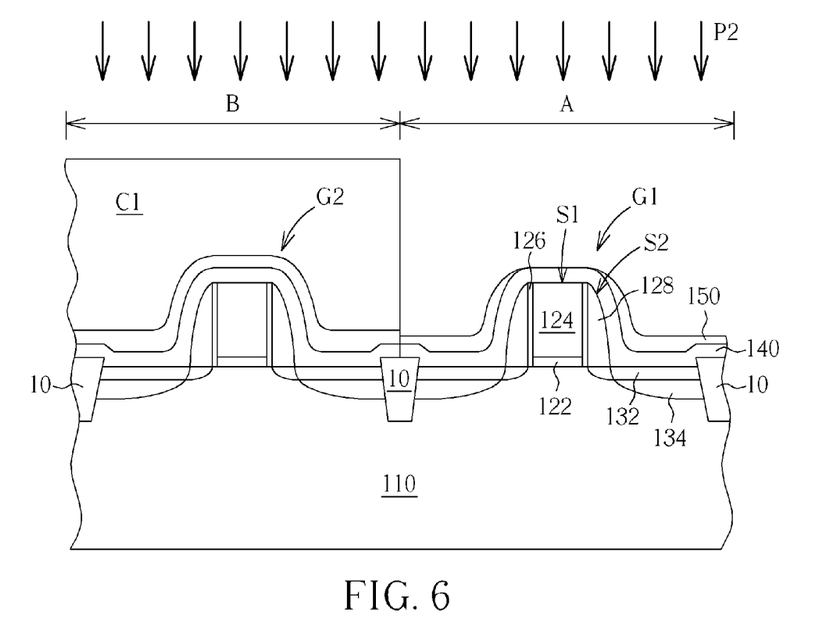

As shown in FIG. 6, a dry etching process P2 is performed to remove parts of the nitride layer 150 on the first structure G1. More precisely, a photoresist (not shown) entirely covers the area A and the area B, and then the photoresist (not shown) is patterned to form a photoresist C1 in the area B. The dry etching process P2 is performed, and only the nitride layer 150 on the first structure G1 in the area A is therefore etched since the area B is covered by the photoresist C1. It is emphasized that a part of the nitride layer 150 on the first structure G1 is etched by the dry etching process P2 while a part of the nitride layer 150 on the first structure G1 is reserved in the present invention. In a preferred embodiment, the nitride layer 150 right above the top surface S1 of the first structure G1 is entirely removed by the dry etching process P2, but the nitride layer 150 right above the sidewalls S2 of the first structure G1 is partially reserved, wherein the nitride layer 150 right above the sidewalls S2 of the first structure G1 covers the spacer 128 and part of the oxide layer 140. In this embodiment, the nitride layer 150 is a stress layer, which applies tensile stresses to a component in the area B (in this embodiment the component is an NMOS transistor), without forcing stresses to a component in the area A (in this embodiment the component is a PMOS transistor), because the PMOS transistor needs compressive stresses, whereas the stress layer applies tensile stresses only. When a tensile stress is applied to a structure, the tensile stress is mainly induced by the part of the stress layer right above the top surface of the structure, while the tensile stress induced by the part of the stress layer right above the sidewalls of the structure can be neglected. When the stress layer covering the structure is damaged or has un-uniform thickness, the stresses applied are dramatically reduced. Therefore, the dry etching process P2 in the present invention merely etches parts of the nitride layer 150 right above the top surface S1 of the first structure G1 while it reserves the nitride layer 150 right above the sidewall S2 of the first structure G1. In this way, components in the area A (the PMOS transistor in this embodiment) are protected by the nitride layer 150 during later annealing processes. Besides, parts of the oxide layer 140 and the spacer 128 covered by the nitride layer 140 can be protected from being etched by later wet etching processes, thereby avoiding the spacer 128 to be damaged.

Figure 7:
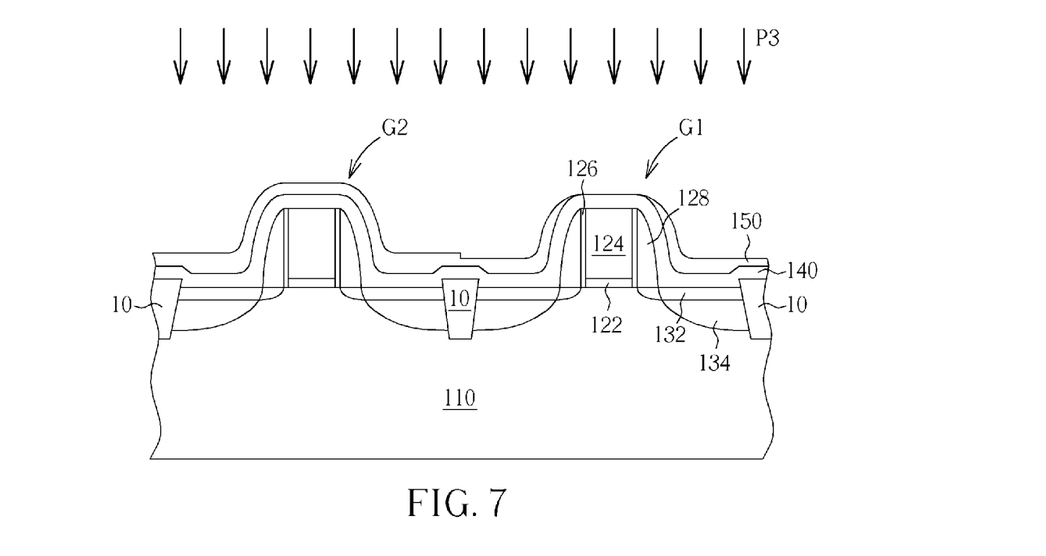

As shown in FIG. 7, an annealing process P3 is performed after the photoresist C1 is removed, in order to activate the source/drain region 134 in the substrate 110 beside the first structure G1 and the second structure G2, and to enable the nitride layer 150 on the second structure G2 to apply stresses on the substrate 110 under the second structure G2, so that the substrate 110 under the second structure G2 can memorize the stresses applied by the stress layer of the nitride layer. In another embodiment, the source/drain region 134 may already be activated after aforesaid source/drain ion implantation process P1 as shown in FIG. 3, so that the annealing process P3 may be performed just for inducing stresses to the substrate 110 beneath the second structure G2. Thus, the processing temperature or processing time etc can be set depending upon the purpose. Furthermore, the annealing process P3 may also be used to activate the source/drain region 134.

Figure 8:
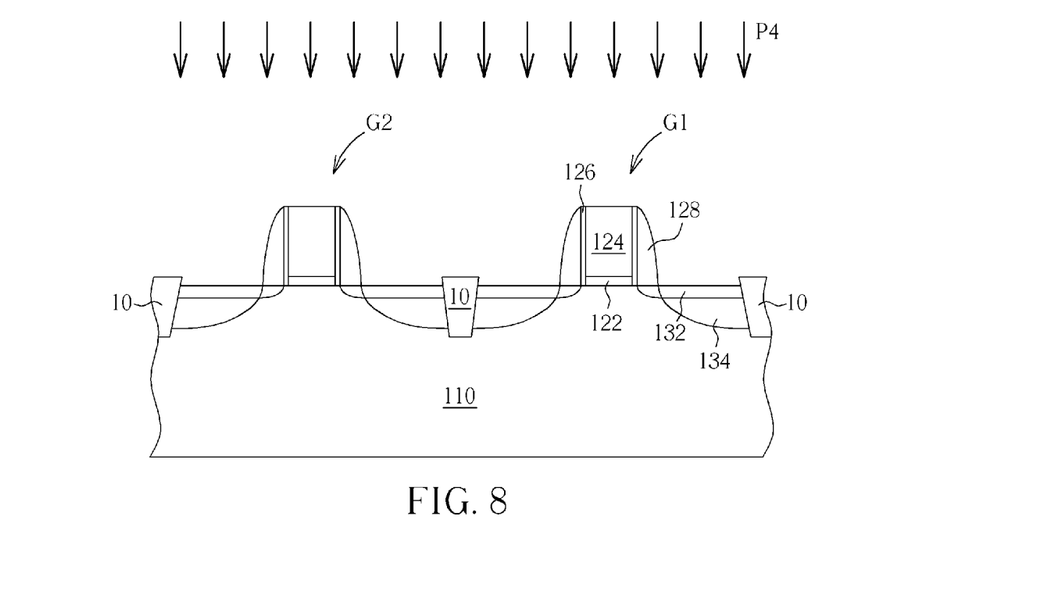

As shown in FIG. 8, a wet etching process P4 is performed to entirely remove the nitride layer 150 and the oxide layer 140 on the first structure G1 and the second structure G2. The etchant of the wet etching process P3 includes phosphoric acid ($H_3PO_4$) or phosphoric acid ($H_3PO_4$) plus dilute hydrofluoric acid (DHF). The phosphoric acid ($H_3PO_4$) is used to etch the nitride layer 150, and the dilute hydrofluoric acid (DHF) is used to etch the oxide layer 140. In practical application, the oxide layer 140 may be etched by phosphoric acid ($H_3PO_4$) while the nitride layer 150 is over-etched, depending upon structural thickness and processing needs. For instance, since the nitride layer 150 and the oxide layer 140 can be etched entirely by the phosphoric acid ($H_3PO_4$) etchant, dilute hydrofluoric acid (DHF) is therefore not needed. In general, the etchant of the wet etching process P4 includes phosphoric acid ($H_3PO_4$) and phosphoric acid ($H_3PO_4$) to entirely remove the nitride layer 150 and the oxide layer 140 on the first structure G1 and the second structure G2.

It is emphasized, as shown in FIGS. 6-8, that a dry etching process P2 is performed to merely remove parts of the nitride layer 150 on the first structure G1. Thereafter, an annealing process is performed to memorize stresses in parts of the substrate 110, and then a wet etching process P4 is performed to entirely remove the nitride layer 150 and the oxide layer 140 on the first structure G1 and the second structure G2. In this way, parts of the nitride layer 150 on the first structure G1 can be removed by performing a dry etching process P2, to keep the stresses induced by the nitride layer 150 in the substrate 110 under the second structure G2. Then, the nitride layer 150 and the oxide layer 140 can be removed entirely by performing the wet etching process. Since a part of the nitride layer 150 is reserved when the wet etching process P4 is performed, the spacer 128 will not be damaged by over-etching.

FIGS. 9-12 depict another embodiment of the present invention. A dual contact etch stop layer (dual CESL) process may be selectively performed by a method similar to aforesaid process, that performs a dry etching process to remove parts of a nitride layer, and then performs a wet etching process to entirely remove the nitride layer and the oxide layer. Therefore, stresses can be memorized in the substrate 110 beneath the first structure M1 or the second structure M2.

Figure 9:
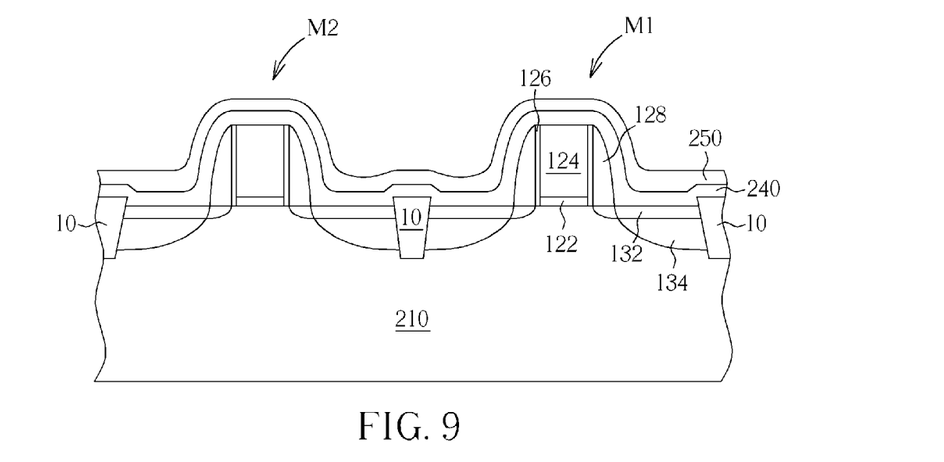
FIGS. 9-12 schematically depict cross-sectional views of a semiconductor process according to another embodiment of the present invention.
Figure 10:
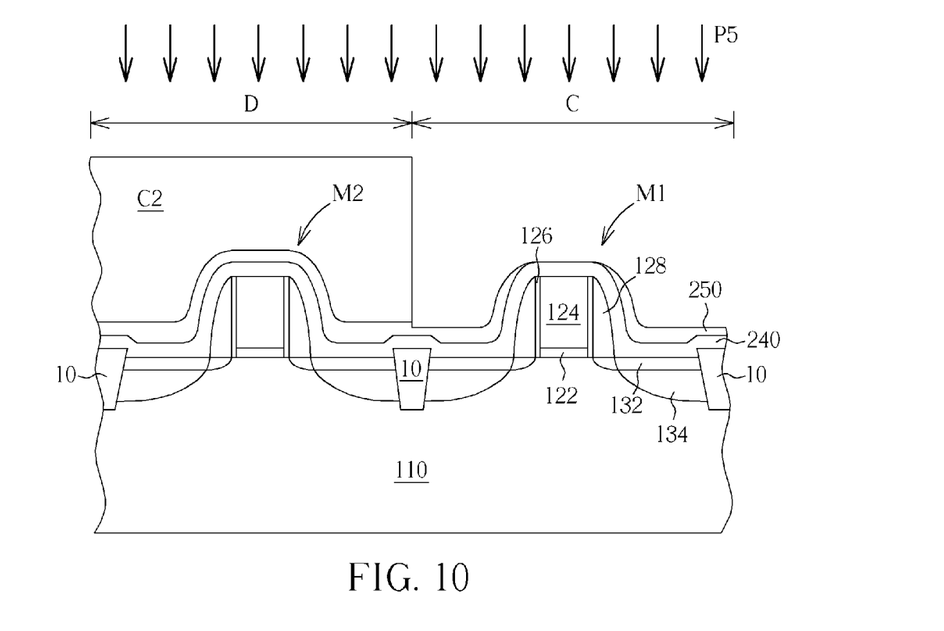

As shown in FIG. 9, an oxide layer 240 and a nitride layer 250 are formed by methods such as a deposition process to entirely cover the first structure M1, the second structure M2 and the substrate 210. In this embodiment, the first structure M1 is a PMOS transistor, and the second structure M2 is an NMOS transistor, but it is not limited thereto. The nitride layer 250 is a stress layer suited for applying stresses to the second structure M2 with the same electrical type only. As shown in FIG. 10, a photoresist (not shown) is formed and entirely covers the first structure M1, the second structure M2 and the substrate 210. The photoresist (not shown) is patterned for covering an area D only. Thereafter, a dry etching process P5 is performed to partially etch the nitride layer 250 of the first structure M1 in an area C since the area D is covered. It is emphasized that the dry etching process P5 of the present invention is performed to etch a part of the nitride layer 250 on the first structure M1 only while a part of the nitride layer 250 on the first structure M1 is reserved.

Figure 11:
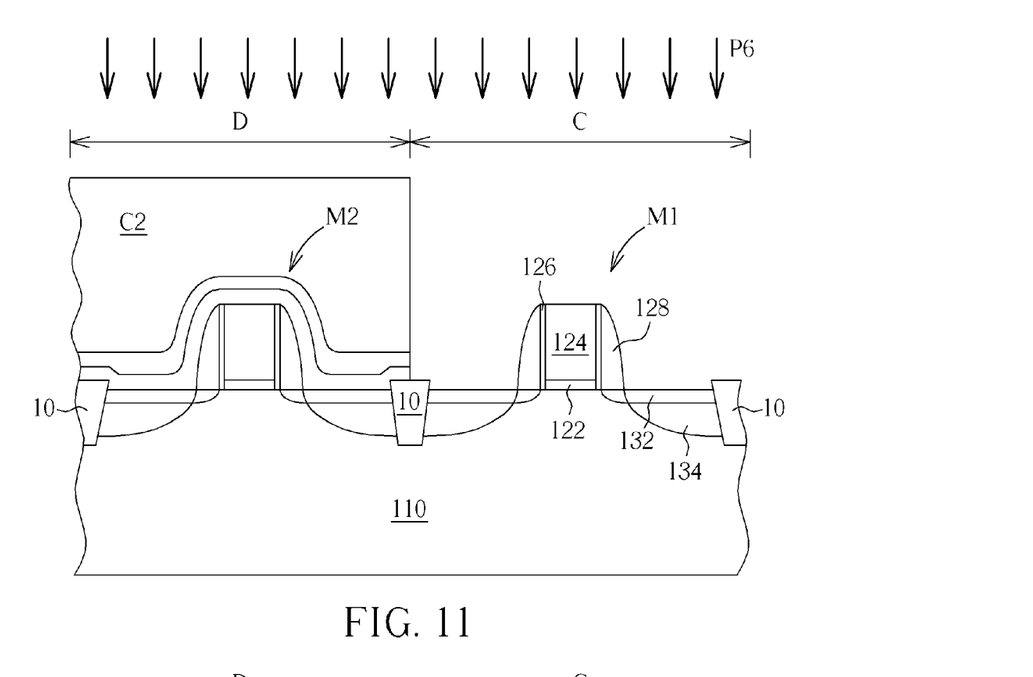

As shown in FIG. 11, a wet etching process P6 is performed to entirely remove the nitride layer 250 and the oxide layer 240 on the first structure M1, and the substrate 210 is therefore exposed. Then, the photoresist C2 is removed. The etchant of the wet etching process P3 includes phosphoric acid ($H_3PO_4$) or phosphoric acid ($H_3PO_4$) plus dilute hydrofluoric acid (DHF). The phosphoric acid ($H_3PO_4$) is used to etch the nitride layer 150, and the dilute hydrofluoric acid (DHF) is used to etch the oxide layer 140. In practical application, the oxide layer 140 may be etched by phosphoric acid ($H_3PO_4$) while the nitride layer 150 is over-etched, depending upon structural thickness and processing needs. For instance, as the nitride layer 150 and the oxide layer 140 can be etched entirely by a phosphoric acid ($H_3PO_4$) etchant, dilute hydrofluoric acid (DHF) is not needed. In general, the etchant of the wet etching process P4 includes phosphoric acid ($H_3PO_4$) and dilute hydrofluoric acid (DHF) to entirely remove the nitride layer 150 and the oxide layer 140 on the first structure M1.

Figure 12:
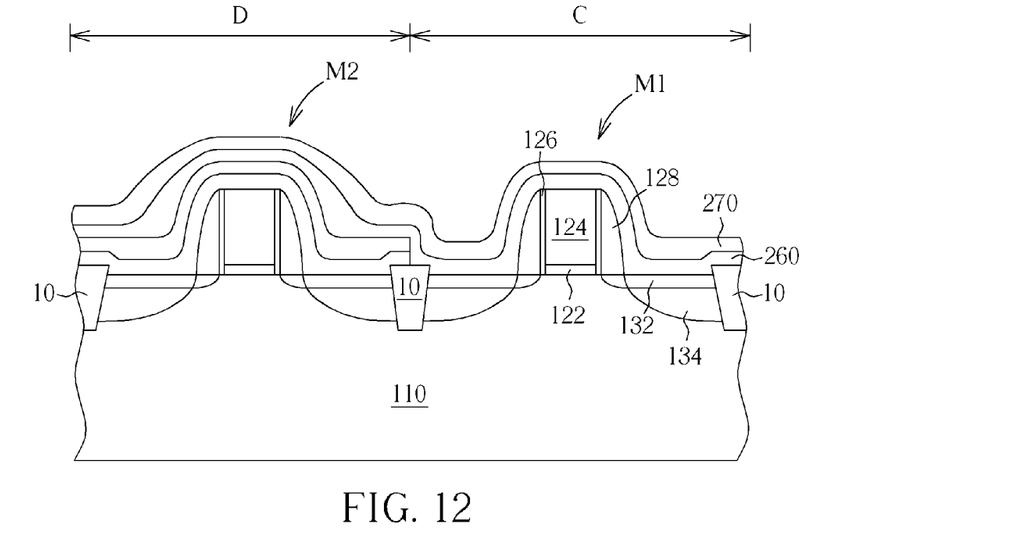

As shown in FIG. 12, an oxide layer 260 and a nitride layer 270 are formed to sequentially and entirely cover the area C and the area D. The nitride layer 270 is a stress layer suited for applying stresses to the first structure M1 with the same electrical type only. Then, the nitride layer 270 in the area D is removed by using aforesaid photoresist (not shown) and using the oxide layer 260 as an etch stop layer, meaning that the dual contact etch stop layer (dual CESL) process is finished.

It is emphasized that a dry etching process P5 is performed in the present invention to merely remove a part of the nitride layer 250 on the first structure M1, and then a wet etching process P6 is performed to entirely remove the nitride layer 250 and the oxide layer 240 on the first structure M1. In this way, most of the nitride layer 250 can be removed by the dry etching process P5, and then the remaining nitride layer 250 and oxide layer 240 can be entirely removed by the wet etching process P6. In the wet etching process P6 it is easier to control stopping depths than in the dry etching process P5, and stopping the etching on the surface S3 of the substrate 110 can be precise. Therefore, damage of the surface S3 of the substrate caused by over-etching while the nitride layer 250 and the oxide layer 240 are entirely removed just by a dry etching process can be avoided.

In another way the stress layer formed and etched to force the substrate 110 beneath the second structure G2 by sequentially performing the dry etching process and the wet etching process can be deposited before the spacer 126 is formed, before the spacer 128 is formed or etc. In one case, an epitaxial layer (not shown) is formed in the substrate 110 beside the first structure G1 and the second structure G2 before the source/drain region 134 is formed, so that a spacer (not shown) is therefore further formed on the substrate 110 beside the spacer 126 after the spacer 126 is formed and before the spacer 128 is formed for defining the locations of the epitaxial layer (not shown). After the spacer (not shown) is formed, a dry etching process and a wet etching process of the present invention may be sequentially performed to apply stresses to the substrate 110. In addition, the epitaxial process may be performed after the source/drain region 134 is formed or performed during the formation of the source/drain region 134. The semiconductor process of the present invention is suitable to be applied to some processing steps of semiconductor processes to form stress layers.

Although FIGS. 1-12 just depict the semiconductor process of the present invention being applied to a planar complementary metal-oxide-semiconductor (CMOS), the semiconductor process of the present invention can also be applied to other semiconductor structures such as a Fin-shaped field effect transistor (FinFET). Since the way of applying the semiconductor process of the present invention to the Fin-shaped field effect transistor (FinFET) is similar to the planar complementary metal-oxide-semiconductor (CMOS), it will not to be described again.

To summarize, the present invention provides a semiconductor process, that performs a dry etching process to remove a part of a stress layer on one of two structures, and then performs a wet etching process to entirely remove the stress layer (and a buffer layer) on the two structures. Thus, the semiconductor process of the present invention can entirely remove the stress layer on the two structures without damaging the spacer layer covered by the stress layer.

Furthermore, the semiconductor process of the present invention can be applied in various processing steps for forming stress layers so as to be applied after/before a source/drain region is formed. Besides, the semiconductor process of the present invention can be applied in a planar complementary metal-oxide-semiconductor (CMOS) or in a Fin-shaped field effect transistor (FinFET) etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   forming a first structure and a second structure on a substrate;
   forming an oxide layer to entirely cover the first structure and the second structure;
   forming a nitride layer to entirely cover the oxide layer;
   performing a dry etching process to remove only a part of the nitride layer directly above the first structure, wherein the part of the nitride layer located on the sides of the first structure above the substrate and all of the oxide layer remain intact; and
   performing a wet etching process to entirely remove the nitride layer and the oxide layer on the first structure and the second structure.

2. The semiconductor process according to claim 1, further comprising:
   performing an annealing process to enable the nitride layer on the second structure to induce stress to the substrate beneath the second structure after the dry etching process is performed.

3. The semiconductor process according to claim 1, further comprising:
   performing a source/drain ion implantation process to form a source/drain region in the substrate beside each of the first structure and the second structure after the wet etching process is performed; and
   performing an annealing process to activate the source/drain region.

4. The semiconductor process according to claim 1, wherein the nitride layer right above the top surface of the first structure is entirely removed while the nitride layer right above the sidewalls of the first structure is partially removed, as the dry etching process is performed.

5. The semiconductor process according to claim 1, wherein the first structure is used for forming a PMOS transistor and the second structure is used for forming an NMOS transistor.

6. The semiconductor process according to claim 1, wherein the nitride layer comprises a stress layer.

7. The semiconductor process according to claim 1, wherein each of the first structure and the second structure comprises a gate structure on the substrate and a spacer on the substrate beside the gate structure.

8. The semiconductor process according to claim 7, wherein the spacer is formed by a precursor of hexachlorodisilane (HCD).

9. The semiconductor process according to claim 1, wherein the etchant of the wet etching process comprises phosphoric acid (H3PO4).

10. The semiconductor process according to claim 9, wherein the etchant of the wet etching process comprises dilute hydrofluoric acid (DHF).

11. The semiconductor process according to claim 1, further comprising:

performing a source/drain ion implantation process to form a source/drain region in the substrate beside each of the first structure and the second structure before the oxide layer is formed.

12. The semiconductor process according to claim 11, further comprising:
performing an annealing process to activate the source/drain region after the source/drain ion implantation process is performed.

13. The semiconductor process according to claim 11, further comprising:
performing an annealing process to activate the source/drain region and to enable the nitride layer on the second structure to induce stress to the substrate beneath the second structure after the dry etching process is performed.

14. A semiconductor process, comprising:
forming a structure on a substrate;
forming an oxide layer entirely covering the structure;
forming a nitride layer entirely covering the oxide layer;
performing a dry etching process to remove only a part of the nitride layer directly above the structure, wherein the part of the nitride layer located on the sides of the structure above the substrate and all of the oxide layer remain intact; and
performing a wet etching process to entirely remove the nitride layer and the oxide layer on the structure.

15. The semiconductor process according to claim 14, wherein the structure comprises a gate structure on the substrate and a spacer on the substrate beside the gate structure.

16. The semiconductor process according to claim 15, wherein the spacer is formed by a precursor of hexachlorodisilane (HCD).

17. The semiconductor process according to claim 14, wherein the etchant of the wet etching process comprises phosphoric acid (H3PO4).

18. The semiconductor process according to claim 17, wherein the etchant of the wet etching process comprises dilute hydrofluoric acid (DHF).

19. The semiconductor process according to claim 14, further comprising:
performing a source/drain ion implantation process to form a source/drain region in the substrate beside the structure before the oxide layer is formed.

20. The semiconductor process according to claim 19, further comprising:
performing an annealing process to activate the source/drain region after the source/drain ion implantation process is performed.

* * * * *